US008587066B2

(12) United States Patent
Zhu et al.

(10) Patent No.: US 8,587,066 B2
(45) Date of Patent: Nov. 19, 2013

(54) STRUCTURE AND METHOD HAVING ASYMMETRICAL JUNCTION OR REVERSE HALO PROFILE FOR SEMICONDUCTOR ON INSULATOR (SOI) METAL OXIDE SEMICONDUCTOR FIELD EFFECT TRANSISTOR (MOSFET)

(75) Inventors: Huilong Zhu, Poughkeepsie, NY (US); Zhijiong Luo, Poughkeepsie, NY (US); Qingqing Liang, Lagrangeville, NY (US); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 13/407,264

(22) Filed: Feb. 28, 2012

(65) Prior Publication Data
US 2012/0153389 A1 Jun. 21, 2012

Related U.S. Application Data

(62) Division of application No. 12/686,402, filed on Jan. 13, 2010, now Pat. No. 8,138,029.

(51) Int. Cl.
*H01L 27/12* (2006.01)
*H01L 21/762* (2006.01)

(52) U.S. Cl.
USPC ............................................. 257/347; 257/350

(58) Field of Classification Search
USPC ................. 257/347–351, 368–412, E27.112, 257/E21.561
See application file for complete search history.

(56) References Cited

U.S. PATENT DOCUMENTS 5,936,280 A * 8/1999 Liu ............................... 257/347
6,882,010 B2 * 4/2005 Bhattacharyya ............. 257/350

* cited by examiner

*Primary Examiner* — Cuong Q Nguyen
(74) *Attorney, Agent, or Firm* — Scully, Scott, Murphy & Presser, P.C.; H. Daniel Schnumann

(57) ABSTRACT

A device and method is provided that in one embodiment provides a first semiconductor device including a first gate structure on a first channel region, in which a first source region and a first drain region are present on opposing sides of the first channel region, in which a metal nitride spacer is present on only one side of the first channel region. The device further includes a second semiconductor device including a second gate structure on a second channel region, in which a second source region and a second drain region are present on opposing sides of the second channel region. Interconnects may be present providing electrical communication between the first semiconductor device and the second semiconductor device, in which at least one of the first semiconductor device and the second semiconductor device is inverted. A structure having a reverse halo dopant profile is also provided.

19 Claims, 13 Drawing Sheets

US 8,587,066 B2

STRUCTURE AND METHOD HAVING ASYMMETRICAL JUNCTION OR REVERSE HALO PROFILE FOR SEMICONDUCTOR ON INSULATOR (SOI) METAL OXIDE SEMICONDUCTOR FIELD EFFECT TRANSISTOR (MOSFET)

CROSS REFERENCE TO RELATED APPLICATION

This application is a divisional of U.S. patent application Ser. No. 12/686,402, filed Jan. 13, 2010 the entire content and disclosure of which is incorporated herein by reference.

BACKGROUND

The present disclosure relates to the fabrication of metal oxide semiconductor field effect transistor (MOSFET) devices, and in particular to a method of fabricating MOSFETS having an asymmetrical junction or a reverse halo profile.

Over the past twenty-five years or so, the primary challenge of very large scale integration (VLSI) has been the integration of an ever-increasing number of MOSFET devices with high yield and reliability. This was achieved mainly by scaling down MOSFET channel lengths without excessive short-channel effects. Short-channel effects are the decrease in threshold voltage ($V_t$) in short-channel devices due to two-dimensional electrostatic charge sharing between the gate and the source/drain regions. Prior attempts to improve short-channel effects include forming retrograded wells by implanting a high concentration of counter-dopant at the channel and source/drain extensions. The high concentration of counter-dopant at the PN junctions (source/channel interface, channel/drain interface) of the device disadvantageously results in increased device leakage.

SUMMARY

A method of forming a device is provided that includes an asymmetrical junction. In one embodiment, the method of providing a device includes providing a substrate having a first semiconductor layer present on a surface of the substrate, and a second semiconductor layer present on the first semiconductor layer, in which the first semiconductor layer has a different composition than the second semiconductor layer. A gate structure of a semiconductor device is formed on a first portion of the second semiconductor layer, and a second portion of the second semiconductor layer that is adjacent to the first portion of the second semiconductor layer is etched. The portion of the first semiconductor layer that is present underlying the second portion of the second semiconductor layer is also etched, and a third semiconductor layer is grown on a remaining thickness of the first semiconductor layer. A region and a drain region of the first semiconductor device may be formed into the third semiconductor layer and the remaining thickness of the first semiconductor layer. Removing at least a portion of the substrate, the first semiconductor layer and the second semiconductor layer that are underlying the gate structure provides a recess that is aligned to the gate structure. A metal nitride spacer is formed on one sidewall of the recess. The recess may be filled with a dielectric material.

In another aspect, a device is provided having an asymmetrical junction. In one embodiment, the device includes a first semiconductor device including a first gate structure on a first channel region of a first semiconductor substrate and a first source region and a first drain region present within the first semiconductor substrate on opposing sides of the first channel region, in which a metal nitride spacer is present on only one side of the first channel region. The device further includes a second semiconductor device including a second gate structure on a second channel region of a second semiconductor substrate and a second source region and a second drain region present within the second semiconductor substrate on opposing sides of the second channel region. At least one inter-level dielectric layer is present between the first semiconductor device and the second semiconductor device, in which at least one of the first semiconductor device and the second semiconductor device is inverted.

Interconnects may be present providing electrical communication between the first semiconductor device and the second semiconductor device, in which the interconnects extend through the at least one inter-level dielectric layer.

In another embodiment, a method of forming a device is provided that includes a reverse dopant profile. Broadly, in one embodiment, the method includes providing a substrate having a first semiconductor layer present on a surface of the substrate, and a second semiconductor layer present on the first semiconductor layer, wherein the first semiconductor layer has a different composition than the second semiconductor layer. A gate structure is formed on a first portion of the second semiconductor layer, and a source region and a drain region are formed adjacent to the first gate structure. At least a portion of the first substrate, the first semiconductor layer and the second semiconductor layer underlying the gate structure are removed to provide a recess aligned to the first gate structure. Dielectric spacers are formed on sidewalls of the recess, and a halo region is implanted into the first semiconductor layer through the recess. The recess is filled with a dielectric material.

In another aspect, a semiconductor device is provided having a reverse halo profile. Broadly, in one embodiment, the semiconductor device includes a first gate structure on a channel region of a semiconductor substrate, and a source region and a drain region present within the semiconductor substrate on opposing sides of the channel region. The source region includes an extension implant portion and a deep implant portion, and the drain region includes an extension implant portion and a deep implant portion. Dielectric spacers are present on each side of the channel region, in which the dielectric spacers are underlying the extension implant portion, and the dielectric spacers are adjacent to the deep implant portion. A halo region may be present in the channel region, in which ends of the halo region are aligned to interior sidewalls of the dielectric spacers.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
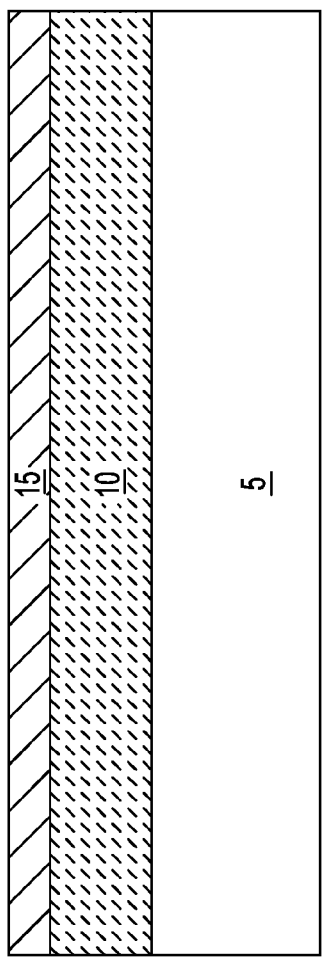
FIG. 1 is a side cross-sectional view depicting one embodiment of providing a first substrate having a first semiconductor layer present on a surface of the first substrate, and a second semiconductor layer present on the first semiconductor layer, as used to provide a structure having an asymmetrical junction, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In one embodiment, the present invention provides methods and structures for reducing short channel effects in semiconductor devices, such as metal oxide semiconductor field effect transistors (MOSFETS). In some embodiments, short channel effects are reduced through the incorporation of an asymmetrical junction. In other embodiments, short channel effects are reduced by a halo region having a reverse dopant profile. When describing the following structures and methods, the following terms have the following meanings, unless otherwise indicated.

As used herein, "gate structure" means a structure used to control output current (i.e. flow of carriers in the channel) of a semiconducting device through electrical or magnetic fields.

The term "channel" is the region underlying the gate structure and between the source region and drain region of a semiconductor device that becomes conductive when the semiconductor device is turned on.

As used herein, the term "drain region" means a doped region in semiconductor device located at the end of the channel, in which carriers are flowing out of the transistor through the drain.

As used herein, the term "source region" is a doped region in the semiconductor device, in which majority carriers are flowing into the channel.

"Epitaxial growth and/or deposition" means the growth of a semiconductor material on a deposition surface of a semiconductor material, in which the semiconductor material being grown has the same crystalline characteristics of the deposition surface of the semiconductor material.

The term "direct contact" means that a first element, such as a first structure, and a second element, such as a second structure, are connected without any intermediary conducting, insulating or semiconductor layers at the interface of the two elements.

The terms "overlying", "atop", "positioned on" or "positioned atop" mean that a first element, such as a first structure, is present on a second element, such as a second structure, wherein intervening elements, such as an interface structure, e.g., interface layer, may be present between the first element and the second element.

FIGS. 1-11 depict one embodiment of a method for forming a semiconductor device having an asymmetrical junction.

An asymmetrical junction is provided by a metal nitride spacer that is positioned in the portion of the channel region that is underlying the extension implant portion of one of the source region or drain region, and is adjacent to the edge of the deep implant portion of one of the source region or drain region. In one embodiment, the presence of the metal nitride spacer reduces the ratio of reverse bias current and forward bias current. In some examples, by reducing the ratio of reverse bias current and forward bias current, the methods and structures disclosed reduce the floating body effect. The floating body effect can typically reduce the threshold voltage (Vt), therefore increasing power consumption. Therefore, in some examples, the methods and structures disclosed herein minimize reductions in threshold voltage (Vt) and increases in power consumption that typically results from floating body effects that are produced in prior methods and structures.

FIG. 1 depicts one embodiment of an initial structure that may be utilized to provide a method of forming a device having an asymmetrical junction. The initial structure typically includes a first substrate 5 having a first semiconductor layer 10 present on a first surface of the substrate 5 and a second semiconductor layer 15 present on the first semiconductor layer 10.

The first substrate 5 may include, but is not limited to Si-containing materials, GaAs, InAs and other like semiconductors. Si-containing materials as used to provide the first substrate 5 include, but are not limited to Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures.

The first semiconductor layer 10 may be composed of any semiconductor material. In one embodiment, the first semiconductor layer 10 is composed of a silicon (Si)-containing material. The term "Si-containing layer" as used herein denotes any semiconductor material that includes silicon. Illustrative examples of various Si semiconductor materials that can be employed in the present invention include, but are not limited to Si, SiGe, SiGeC, SiC and other like Si-containing materials. The first semiconductor layer 10 may also be Ge, Ge alloys, GaAs, InAs, InP as well as other III/V and II/VI compound semiconductors. Combinations of the aforementioned semiconductor materials can also be used. In one embodiment, the first semiconductor layer 10 is silicon germanium.

The first semiconductor layer 10 may be formed on the first substrate 5 using a deposition method, such as chemical vapor deposition (CVD) or physical vapor deposition. "Chemical Vapor Deposition" is a deposition process in which a deposited species is formed as a result of a chemical reaction between gaseous reactants at greater than room temperature, wherein a solid product of the reaction is deposited on the surface on which a film, coating, or layer of the solid product is to be formed. Variations of CVD processes suitable for providing the conformally deposited first semiconductor layer 10 include, but are not limited to Atmospheric Pressure CVD (APCVD), Low Pressure CVD (LPCVD), Plasma Enhanced CVD (EPCVD), Metal-Organic CVD (MOCVD), and combinations thereof. It is noted that the formation of the first semiconductor layer 10 is not limited to deposition methods, as growth methods such as epitaial growth can also be employed contemplated for forming the first semiconductor layer 10.

In one embodiment, the first semiconductor layer 10 may have a thickness ranging from 5 nm to 150 nm. In another embodiment, the first semiconductor layer 10 may have a thickness ranging from 50 nm to 100 nm. In an even further embodiment, the first semiconductor layer 10 may have a thickness ranging from 75 nm to 85 nm.

In one example, the first semiconductor layer 10 is silicon germanium that is formed using an epitaxial deposition process. In one embodiment, the silicon germanium of the first semiconductor layer 10 has a germanium content that ranges from 1% to 50%. In another embodiment, the first semiconductor layer 10 is composed of silicon germanium that has a germanium content ranging from 1% to 25%. In yet another embodiment, the germanium content of the silicon germanium of the first semiconductor layer ranges from 5% to 10%.

In one embodiment, when the chemical reactants of the epitaxial deposition process are controlled and the system parameters set correctly, the depositing atoms arrive at the surface of the first substrate 5 with sufficient energy to move around on the surface of the first substrate 5 and orient themselves to the crystal arrangement of the atoms of the deposition surface. Thus, an epitaxial film deposited on a {100} crystal surface will take on a {100} orientation. If, on the other hand, the deposition surface has an amorphous surface layer, possibly the result of implanting, the depositing atoms have no surface to align to, resulting in the formation of polysilicon instead of single crystal silicon. A number of different sources may be used for the deposition of epitaxial silicon. Silicon sources for epitaxial growth include silicon tetrachloride, dichlorosilane ($SiH_2Cl_2$), and silane ($SiH_4$). Germanium sources for epitaxial growth include $GeH_4$, $Ge_2H_6$, $Ge_3H_3$, $GeH_3Br$, $GeH_3Cl$, $GeF_3Cl$, $GeH_2Br_2$, $GeH_2Cl_2$, $GeCl_2F_2$, $GeHCl_3$, $GeCl_3F$, $GeCl_4$, $GeBr_4$, and $GeHBr_3$. The temperature for epitaxial silicon germanium deposition typically ranges from 550° C. to 900° C. Although higher temperature typically results in faster deposition, the faster deposition may result in crystal defects and film cracking.

The second semiconductor layer 15 is typically composed of a semiconductor material having a different composition than the first semiconductor material 10. Similar to the first semiconductor layer 10, the second semiconductor layer 15 may be a silicon-containing layer. Examples of silicon containing materials suitable for the second semiconductor layer 15 include, but are not limited to Si, SiGe, SiGeC, SiC and other like Si-containing materials. The second semiconductor layer 15 may also be Ge, Ge alloys, GaAs, InAs, InP as well as other III/V and II/VI compound semiconductors. Combinations of the aforementioned semiconductor materials can also be used as the second semiconductor layer 15.

The second semiconductor layer 15 may be formed using a growth or deposition method as described above for the first semiconductor layer 10. In one embodiment, the second semiconductor layer 15 may be composed of silicon and is formed using an epitaxial growth process. In one example, epitaxial Si growth may occur when silicon atoms are deposited on a silicon-containing surface in a CVD reactor.

A number of different sources may be used for the deposition of epitaxial silicon. Silicon tetrachloride ($SiCl_4$) is one source of silicon for epitaxial deposition. Silicon tetrachloride reacts with a Si surface in the following manner:

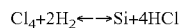

$$Cl_4 + 2H_2 \leftrightarrow Si + 4HCl$$

The temperature for epitaxial silicon deposition typically ranges from about 600° C. to about 900° C.

Another epitaxial Si source is silane ($SiH_4$). The silane epitaxial growth reaction is as follows:

$$H_4 + HEAT \rightarrow Si + 2H_2.$$

Dichlorosilane (SiH$_2$Cl$_2$) may also be used as the epitaxial Si source. Dichlorosilane is also a low temperature source. The dichlorosilane epitaxial growth reaction is as follows:

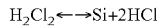

$$H_2Cl_2 \leftarrow\rightarrow Si + 2HCl$$

In some embodiments of the invention, the second semiconductor layer 15 may be formed using a deposition process, such as chemical vapor deposition (CVD) or physical vapor deposition (PVD).

The second semiconductor layer 15 may have a thickness ranging from 5 nm to 150 nm. In another embodiment, the second semiconductor layer 15 may have a thickness ranging from 50 nm to 100 nm. In an even further embodiment, the second semiconductor layer 15 may have a thickness ranging from 75 nm to 85 nm. In one example, the second semiconductor layer 15 is silicon formed using epitaxial deposition, in which second semiconductor layer 15 and has a thickness ranging from 50 nm to 100 nm.

Figure 2:
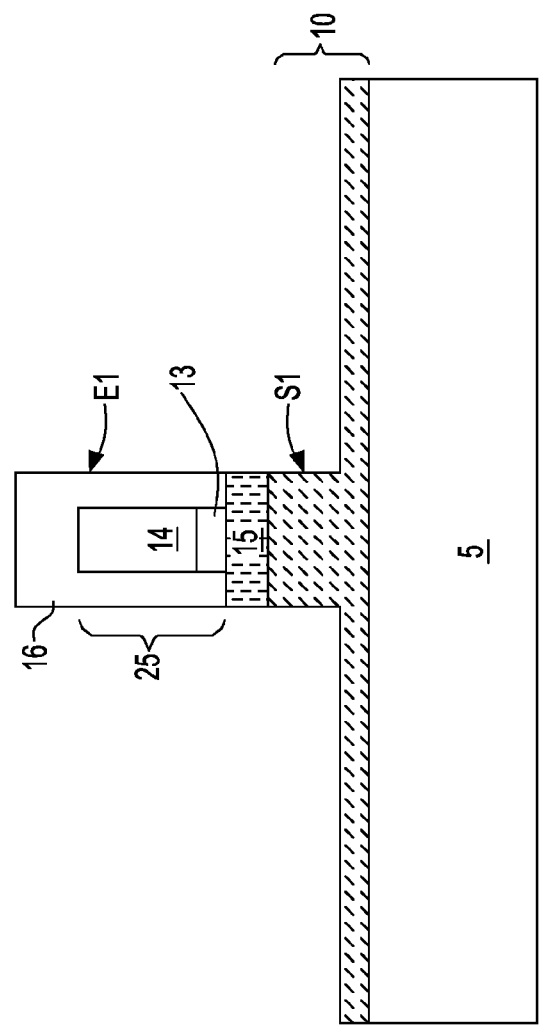
FIG. 2 is a side cross-sectional view depicting forming a first gate structure of a first semiconductor device on a first portion of the second semiconductor layer, and etching the second semiconductor layer and the first semiconductor layer, in accordance with one embodiment of the present invention.

Referring to FIG. 2, the first gate structure 25 may be formed on the second semiconductor layer 15 utilizing deposition, lithography and etching processes. More specifically, and in one embodiment, the first gate structure 25 is provided atop the second semiconductor layer 15 by depositing a first gate dielectric 13 followed by a first gate conductor 14 to provide a gate stack. In a following process step, the gate stack is patterned using photolithography and etched to produce the first gate structure 25. For example, following the deposition of the first gate dielectric 13 and first gate conductor 14, an etch mask can be formed atop the first gate conductor 14 protecting the portion of the layered stack that provides the first gate structure 25, wherein the portions exposed by the etch mask can be removed by an anisotropic etch process, such as a reactive ion etch. Reactive ion etch (RIE) is a form of plasma etching, in which the surface to be etched is placed on the RF powered electrode and takes on a potential that accelerates an etching species, which is extracted from a plasma, towards the surface to be etched, wherein a chemical etching reaction takes place in the direction normal to the surface being etched. In one embodiment, the etch mask may be provided by a patterned photoresist layer, or may be provided by a hard mask (not shown). In some embodiments, a replacement gate process can be used in forming first gate structure 25.

The first gate dielectric 13 of the first gate structure 25 may be composed of an oxide material. Suitable examples of oxides that can be employed as the first gate dielectric 13 include, but are not limited to SiO$_2$, Al$_2$O$_3$, ZrO$_2$, HfO$_2$, Ta$_2$O$_3$, TiO$_2$, perovskite-type oxides and combinations and multi-layers thereof. The first gate dielectric 13 may also be composed of a nitride, oxynitride, or a combination thereof. The first gate conductor 14 of the gate stack may be composed of a silicon containing material, which may be polysilicon. In another embodiment, the first gate conductor 14 is composed of single crystal Si, SiGe, SiGeC or combinations thereof. In another embodiment, the first gate conductor 14 may be a metal and/or silicide. In other embodiment, the first gate conductor 14 is comprised of multilayered combinations of said conductive materials.

In one embodiment, a dielectric cap 16 may be formed in direct physical contact with the sidewall and upper surface of the first gate structure 25. More specifically, the dielectric cap 16 may be in direct physical contact with the sidewall of the first gate dielectric 13, the sidewall of the first gate conductor 14, and an upper surface of the first gate conductor 14. The dielectric cap 16 may comprise a dielectric such as a nitride, oxide, oxynitride, or a combination thereof. In one embodiment, in which the dielectric cap 16 is composed of a nitride, such as silicon nitride, the dielectric cap 16 may be formed using deposition and etch processes. In one embodiment, the dielectric cap 16 is provided by a conformal dielectric layer. The term "conformal" denotes a layer having a thickness that does not deviate from greater than or less than 20% of an average value for the thickness of the layer. In one example, the dielectric cap 16 has a thickness of less than 10 nm, typically ranging from 2 nm to 5 nm.

FIG. 2 also depicts one embodiment of etching the second semiconductor layer 15 and a portion of the first semiconductor layer 10 using the first gate structure 25 as an etch mask. In one embodiment, only a portion of the first semiconductor layer 10 is removed by the etch process so that a remaining thickness of the first semiconductor layer 10 is present adjacent to the portion of the first semiconductor layer 10 that is underlying the first gate structure 25. In one embodiment, an anisotropic etch process produces an island of a remaining portion of the second semiconductor layer 15, and a remaining portion of the first semiconductor layer 10 having its original thickness, which is present underlying the first gate structure 25. As used herein, the term "anisotropic etch process" denotes a material removal process in which the etch rate in the direction normal to the surface to be etched is much higher than in the direction parallel to the surface to be etched. One example of an anisotropic etch process is reactive ion etching (RIE). Alternatively, the anisotropic etch process may be provided by laser ablation.

In one embodiment, the etch process that removes the exposed portion of the second semiconductor layer 15 is a selective etch process. As used herein, the term "selective" in reference to a material removal process denotes that the rate of material removal for a first material is greater than the rate of removal for at least another material of the structure to which the material removal process is being applied. In one example, the etch chemistry that removes the second semiconductor layer 15 is selective to the dielectric cap 16 that is present on the first gate structure 25, and the first semiconductor layer 10. In one embodiment, following removal of the second semiconductor layer 15, the first semiconductor layer 10 may be etched so that a remaining thickness of the first semiconductor layer 10 is present on the first substrate 5. The etch chemistry for etching the first semiconductor layer 10 may be different than the etch chemistry for etching the second semiconductor layer 15, in which the etch chemistry for etching the first semiconductor layer 10 is selective to the dielectric cap 16. In another example, the first semiconductor layer 10 may be etched by the same etch chemistry that removes the second semiconductor layer 15.

The remaining thickness of the first semiconductor layer 10 that is present on the substrate 5 typically ranges from 5 nm to 50 nm. In another embodiment, the remaining thickness of the first semiconductor layer 10 that is present on the substrate 5 ranges from 10 nm to 40 nm. As illustrated in FIG. 2, the edges S1 of the remaining portions of the second semiconductor layer 15 and the etched portion of the first semiconductor layer 10 are aligned to the exterior sidewall E1 of the dielectric cap 16. Following etching of the first semiconductor layer 10, the dielectric cap 16 may be removed by an etch process that is selective to the first gate structure 25.

Figure 3:
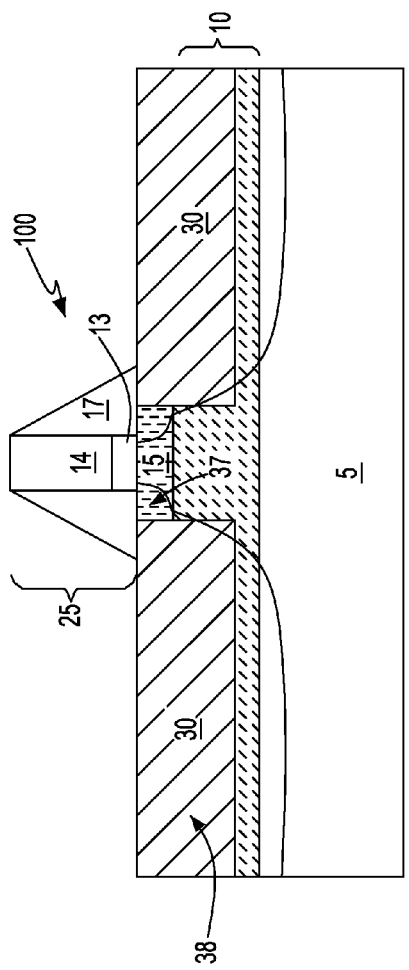
FIG. 3 is a side cross-sectional view depicting growing a third semiconductor layer on a remaining thickness of the first semiconductor layer, and forming a source region and a drain region of the first semiconductor device, in accordance with one embodiment of the present invention.

FIG. 3 depicts forming a third semiconductor layer 30 on the remaining thickness of the first semiconductor layer 10. In one embodiment, the third semiconductor layer 30 is formed using an epitaxial growth process similar to the epitaxial growth process for forming the second semiconductor layer 15, as described with reference to FIG. 1. The third semiconductor layer 30 may be a silicon-containing material. Some examples of semiconductor compositions suitable for the third semiconductor layer 30 include, but are not limited to single crystal Si, SiGe, SiGeC or combinations thereof. In one embodiment, the growth process to provide the third semiconductor layer 30 is continued until the upper surface of the third semiconductor material 30 is coplanar with the upper surface of the second semiconductor layer 15 on which the first gate structure 25 is present.

FIG. 3 also depicts forming a source region and a drain region in at least the third semiconductor layer 30. The source and drain regions include an extension implant portion 37 and a deep implant portion 38. In some embodiments, ion implantation of different doses and implant energies in combination with sidewall spacers 17 adjacent to the first gate structure 25 dictate the location and abruptness of the source and drain regions. Each sidewall spacer 17 may have a width ranging from 30.0 nm to 100.0 nm, and may be composed of a dielectric material, such as an oxide, nitride or oxynitride. The sidewall spacers 17 may be formed by deposition and etch processes. In one embodiment, a first sidewall spacer may be formed prior to forming the extension implant portion 37, and a second wider sidewall spacer may be formed prior to the deep implant portion 38.

In one embodiment, extension implant portion 37 is formed using an ion implantation process step. More specifically, when forming a p-type extension implant portions 37 a typical dopant species is boron or $BF_2$. Boron may be implanted utilizing implant energies ranging from 0.2 keV to 3.0 keV with an implant dose ranging from $5 \times 10^{14}$ atoms/cm$^2$ to $5 \times 10^{15}$ atoms/cm$^2$. $BF_2$ may be implanted utilizing implant energies ranging from 1.0 keV to 15.0 keV and a dose ranging from $5 \times 10^{14}$ atoms/cm$^2$ to $5 \times 10^{15}$ atoms/cm$^2$. A typical implant for the n-type extension implant portion 37 is arsenic. The n-type extension implant portions 37 can be implanted with arsenic using implant energies ranging from 1.0 keV to 10.0 keV with a dose ranging from $5 \times 10^{14}$ atoms/cm$^2$ to $5 \times 10^{15}$ atoms/cm$^2$.

The deep implant portion 38 of the source region and the drain region is then implanted by ion implantation. Typical implant species for the n-type deep implant portion 38 for the source region and the drain region may be phosphorus or arsenic. The n-type dopant for the deep implant portion 38 of the source region and the drain region may be phosphorus implanted using an energy ranging from 3.0 keV to 15.0 keV with a dose ranging from $1 \times 10^{15}$ atoms/cm$^2$ to $7 \times 10^{15}$ atoms/cm$^2$. The n-type dopant for the deep implant portion 38 of the source region and the drain region may also be arsenic implanted using an energy ranging from 6.0 keV to 30.0 keV with a dose ranging from $1 \times 10^{15}$ atoms/cm$^2$ to $7 \times 10^{15}$ atoms/cm$^2$. Typical implant species for the p-type deep implant portion 38 of the source region and the drain region may include boron or $BF_2$. The p-type dopant for the deep implant portion 38 of the source region and the drain region can also be boron implanted utilizing an energy ranging from 1.0 keV to 8.0 keV with a dose ranging from $1 \times 10^{15}$ atoms/cm$^2$ to $7 \times 10^{15}$ atoms/cm$^2$. The p-type dopant for the deep implant portion 38 of the source region and the drain region may also be $BF_2$ implanted with an energy ranging from 5.0 keV to 40.0 keV and a dose ranging from $1 \times 10^{15}$ atoms/cm$^2$ to $7 \times 10^{15}$ atoms/cm$^2$. The source and drain regions may in some embodiments include metal semiconductor alloy contact regions, e.g., silicides, at an upper surface of the source and drain regions. It is noted that in some embodiments the first semiconductor device 100 is formed at this point of the method sequence.

Figure 4:
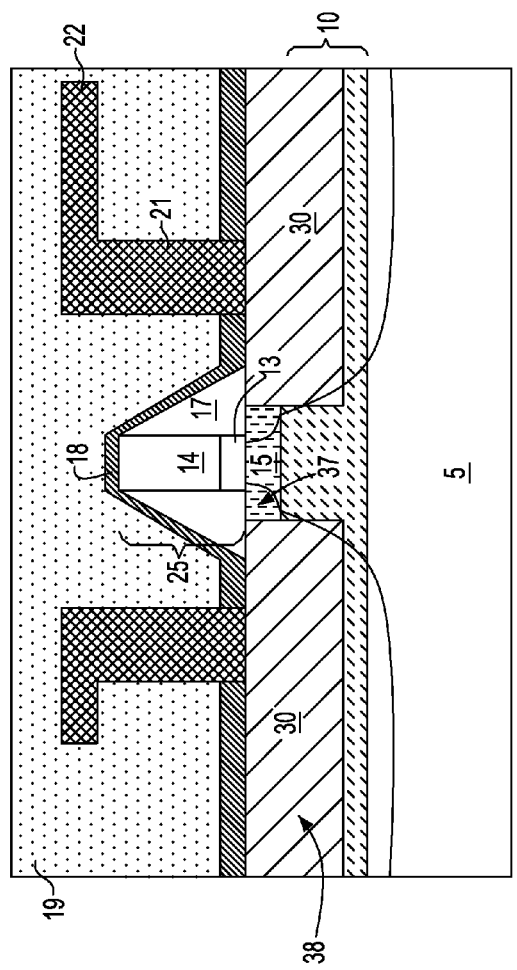
FIG. 4 is a side cross-sectional view depicting forming a first inter-level dielectric layer overlying the first semiconductor device, in accordance with one embodiment of the present invention

Referring to FIG. 4, a passivation layer 18 may be deposited over the first gate structure 25 and the source region including implant portions 37, 38 and the drain region including implant portions 37, 38 of the first semiconductor device 100. The passivation layer 18 is typically a conformally deposited dielectric layer. Suitable dielectric materials for the passivation layer 18 include oxide, nitrides or oxynitride materials. The passivation layer 18 typically has a thickness ranging from 5 nm to 50 nm, typically ranging from 10 nm to 20 nm being more typical. The passivation layer 18 may be formed using thermal growth or deposition processes. For example, in the embodiments in which the passivation layer 18 is deposited, the passivation layer 18 may be deposited using chemical vapor deposition (CVD). In the embodiments in which the passivation layer 18 is grown, the passivation layer 18 may be formed using thermal growth process, such as thermal oxidation.

A first inter-level dielectric layer 19 may be blanket deposited atop the passivation layer 18 and planarized. The first inter-level dielectric layer 19 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, $\alpha$-C:H). Additional choices for the first inter-level dielectric layer 19 include: any of the aforementioned materials in porous form. The blanket layer of the first inter-level dielectric layer 19 may be formed by deposition methods including, but not limited to spinning from solution, spraying from solution, chemical vapor deposition (CVD), plasma enhanced CVD (PECVD), sputter deposition, reactive sputter deposition, ion-beam deposition, and evaporation.

The blanket layer of first inter-level dielectric layer 19 may be patterned and etched to form via holes to the source region and the drain region. Following via formation, first conductive studs 21 can be formed by depositing a conductive metal into the via holes using chemical vapor deposition (CVD), sputtering or plating. The conductive metal may include, but is not limited to tungsten, copper, aluminum, silver, gold, and alloys thereof. First interconnect lines 22 can also be formed in electrical communication with the first conductive studs 21. Similar to the first conductive studs 21, the first interconnect lines 22 may be composed of a conductive metal that can include, but is not limited to tungsten, copper, aluminum, silver, gold, and alloys thereof, which may be deposited by chemical vapor deposition (CVD), sputtering or plating.

Figure 5:
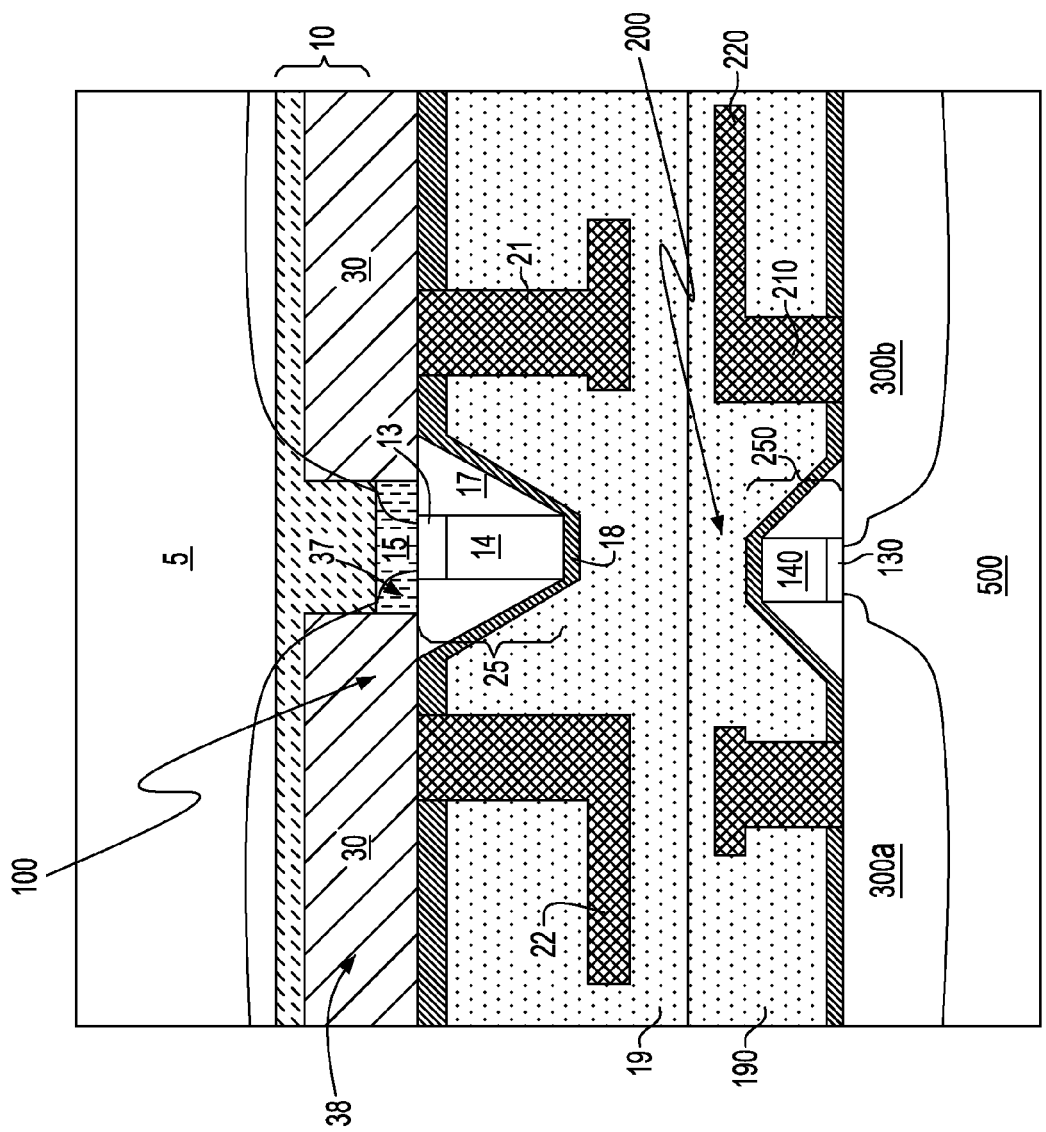
FIG. 5 is a side cross-sectional view depicting bonding the first inter-level dielectric layer of the first semiconductor device to a second inter-level dielectric layer that is overlying a second gate structure and second source region and second drain region of a second semiconductor device, in which at least one of the first semiconductor device and the second semiconductor device are inverted, in accordance with one embodiment of the present invention.

FIG. 5 depicts bonding the first inter-level dielectric layer 19 of the first semiconductor device 100 to a second inter-level dielectric layer 190 that is overlying a second gate structure 250 and second source region and second drain region of a second semiconductor device 200, in which at least one of the first semiconductor device 100 and the second semiconductor device 200 are inverted. The term "inverted" as used to describe the geometric relationship of the first semiconductor device 100 to the second semiconductor device 200 means that the one of the first and the second semiconductor devices 100, 200 has been flipped.

The second semiconductor device 200 typically includes a second gate structure 250, and a second source region 300$a$ and second drain region 300$b$. One example of a process sequence employed to form the second semiconductor device 200 includes the following: depositing a second gate dielectric 130 on an exposed surface of a second semiconductor substrate 500; forming a second gate conductor 140 on the second gate dielectric 130, patterning the gate conductor 140 and gate dielectric 130 to provide the second gate structure 250; and ion implantation of the exposed portion of the second semiconductor substrate 500 adjacent to the second gate structure 250 with n-type or p-type dopants to provide the second source region 300a and the second drain region 300b.

In one embodiment, forming interconnect structures to the second semiconductor device 200 includes the following: blanket depositing a layer of a second inter-level dielectric layer 190 atop the second semiconductor substrate 500; planarizing the blanket layer of the second inter-level dielectric 190; patterning and etching the second inter-level dielectric 190 to form via holes to the second source region 300a and the second drain region 300b; forming second conductive studs 210 within the vias; and forming a second interconnect line 220 in electrical communication with the second conductive studs 210.

In one embodiment, the first inter-level dielectric 19 of the first semiconductor device 100 is bonded to the second inter-level dielectric 190 of the second semiconductor device 200 using adhesive bonding or thermal bonding. Examples of adhesives suitable for bonding the first inter-level dielectric 19 of the first semiconductor device 100 to the second inter-level dielectric 190 of the second semiconductor device 200 include solder, wax and polymer adhesives. In the embodiments utilizing thermal bonding methods, the first semiconductor device 100 is thermally bonded to the second semiconductor device 200 by contacting a planar surface of first inter-level dielectric 19 to a planar surface of the second inter-level dielectric 190 under increased temperature and an optional application of pressure. In one example, the temperature of the thermal bonding method may range from 100° C. to 400° C.

Figure 6:
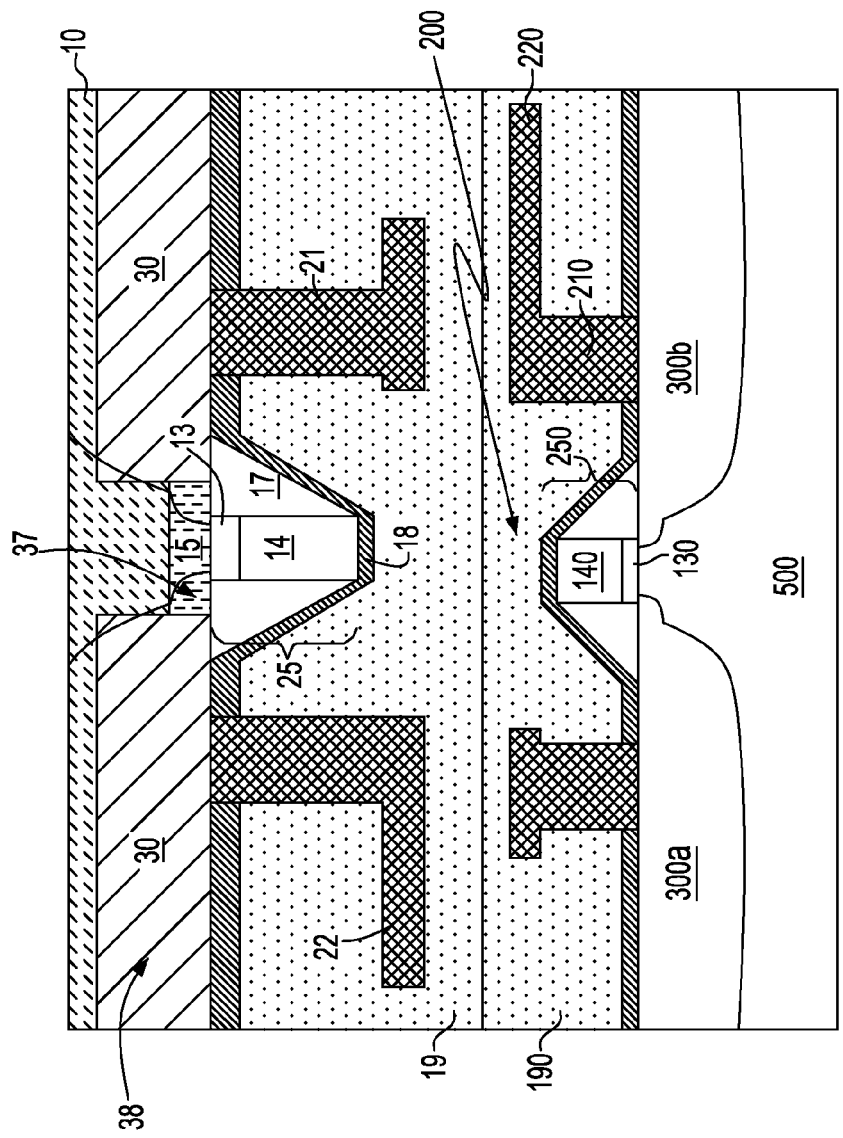
FIG. 6 is a side cross-sectional view depicting removing the first substrate to expose a surface of the first semiconductor layer that is opposite the surface of the first semiconductor layer that is in contact with the second semiconductor layer, in accordance with one embodiment of the present invention.

FIG. 6 depicts removing the first substrate 5 from the structure depicted in FIG. 5, wherein removing the first substrate 5 exposes the first semiconductor layer 10. In one embodiment, the first substrate 5 may be removed by an etch process, such as a dry etch process, e.g., RIE, or a wet etch process. In another embodiment, the first substrate 5 may be removed using planarization, in which the planarization process stops when reaching the first semiconductor layer 10. Planarization is a material removal process that employs at least mechanical forces, such as frictional media, to produce a planar surface. One example of planarization suitable for removing the first substrate 5 is chemical mechanical planarization (CMP). Chemical mechanical planarization (CMP) is a material removal process using both chemical reactions and mechanical forces to remove material and planarize a surface.

Figure 7:
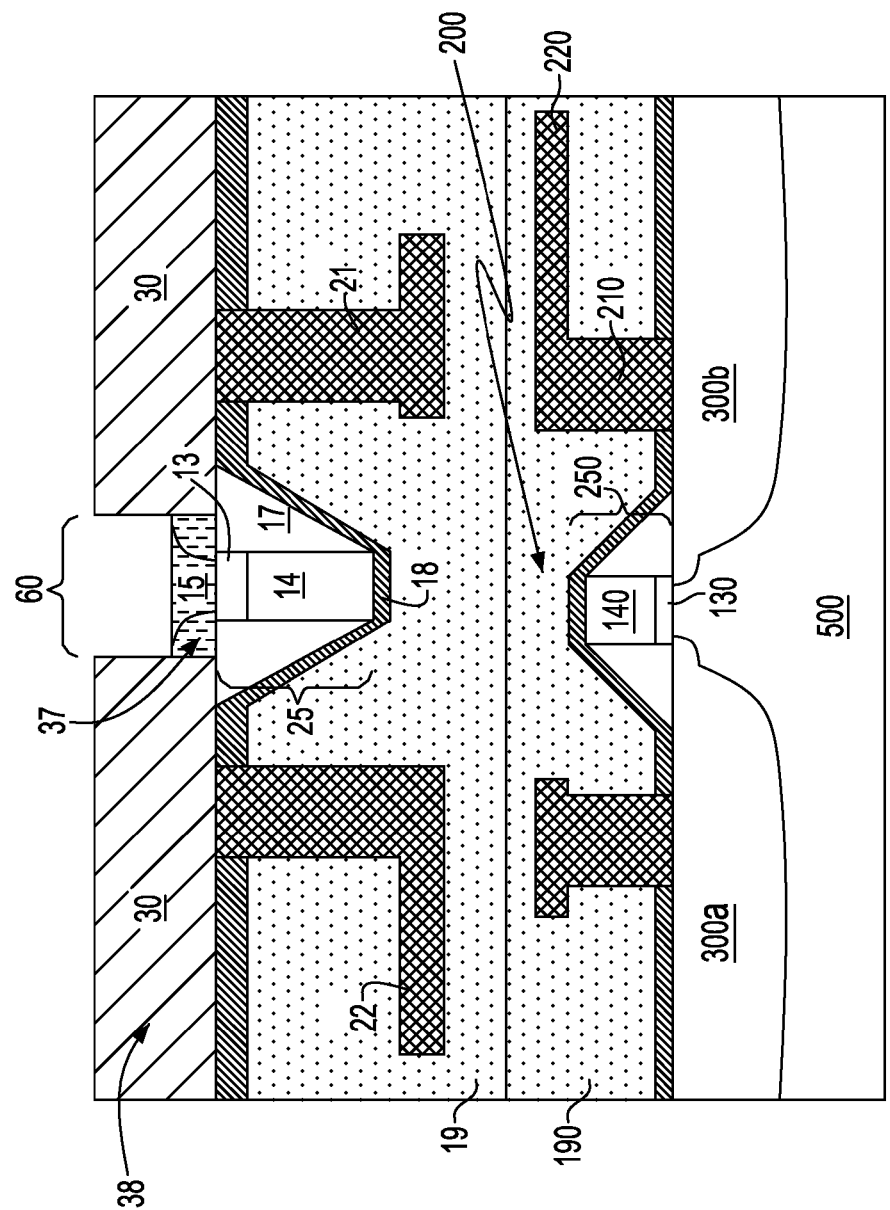
FIG. 7 is a side cross-sectional view depicting one embodiment of removing the first semiconductor layer selective to the second (and the third) semiconductor layer to provide a recess aligned to the first gate structure.

FIG. 7 depicts removing the first semiconductor layer 10 that is present underlying the first gate structure 25 to provide a recess 60 aligned to the first gate structure 25. In one embodiment, the recess 60 is provided by removing the remaining portion of the first semiconductor layer 10 by an etch processes that is selective to the second semiconductor layer 15 and the third semiconductor layer 30. In one embodiment, the etch process for removing the first semiconductor layer 10 is a wet chemical etch. In another embodiment, the first semiconductor layer 10 is removed by an anisotropic etch, such as reactive ion etch (RIE).

Figure 8:
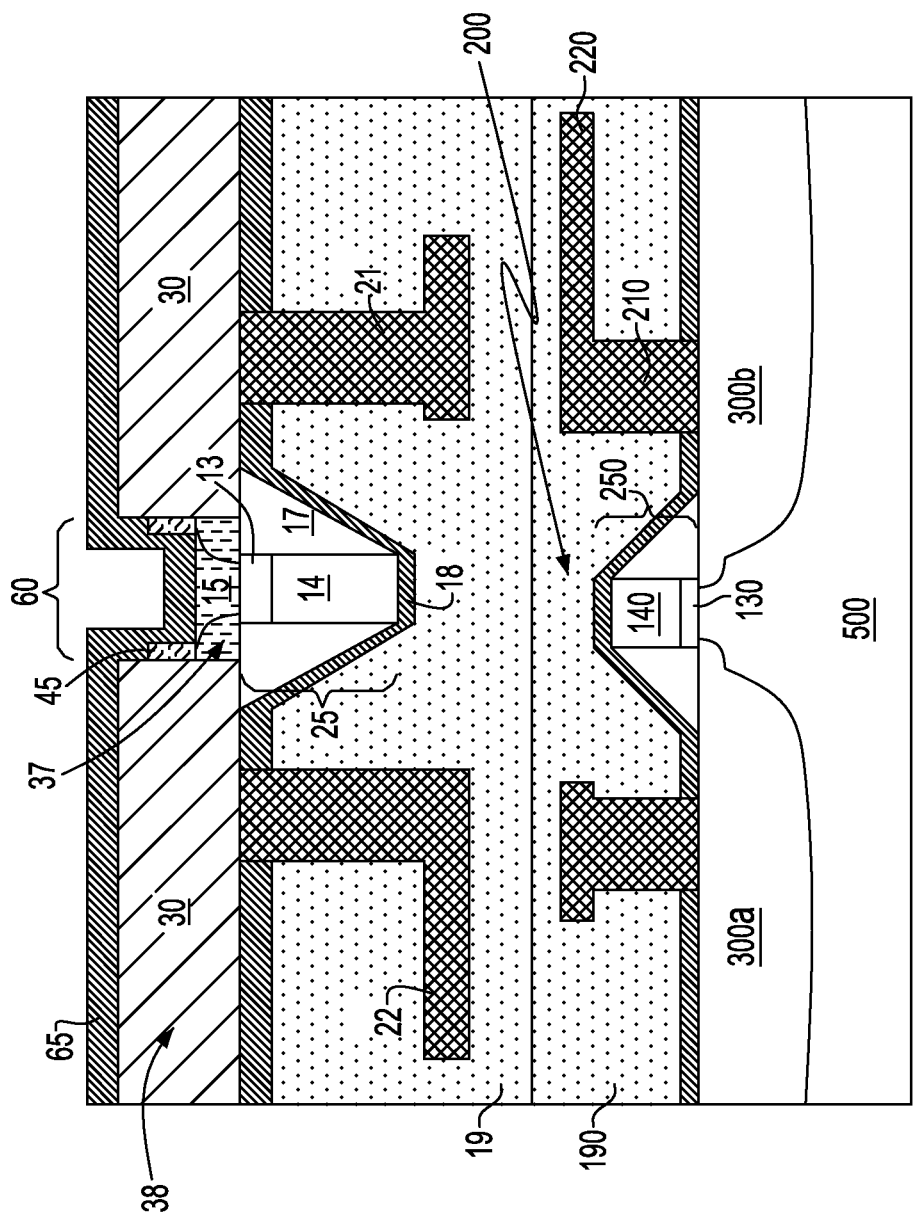
FIG. 8 is a side cross-sectional view depicting depositing a metal nitride layer on a base and sidewalls of the recess, etching the metal nitride layer, wherein a remaining portion of the metal nitride layer is present on only the sidewalls of the recess, and depositing a conformal dielectric layer on the remaining portion of the metal nitride layer and the base of the recess, in accordance with one embodiment of the present invention.
Figure 9:
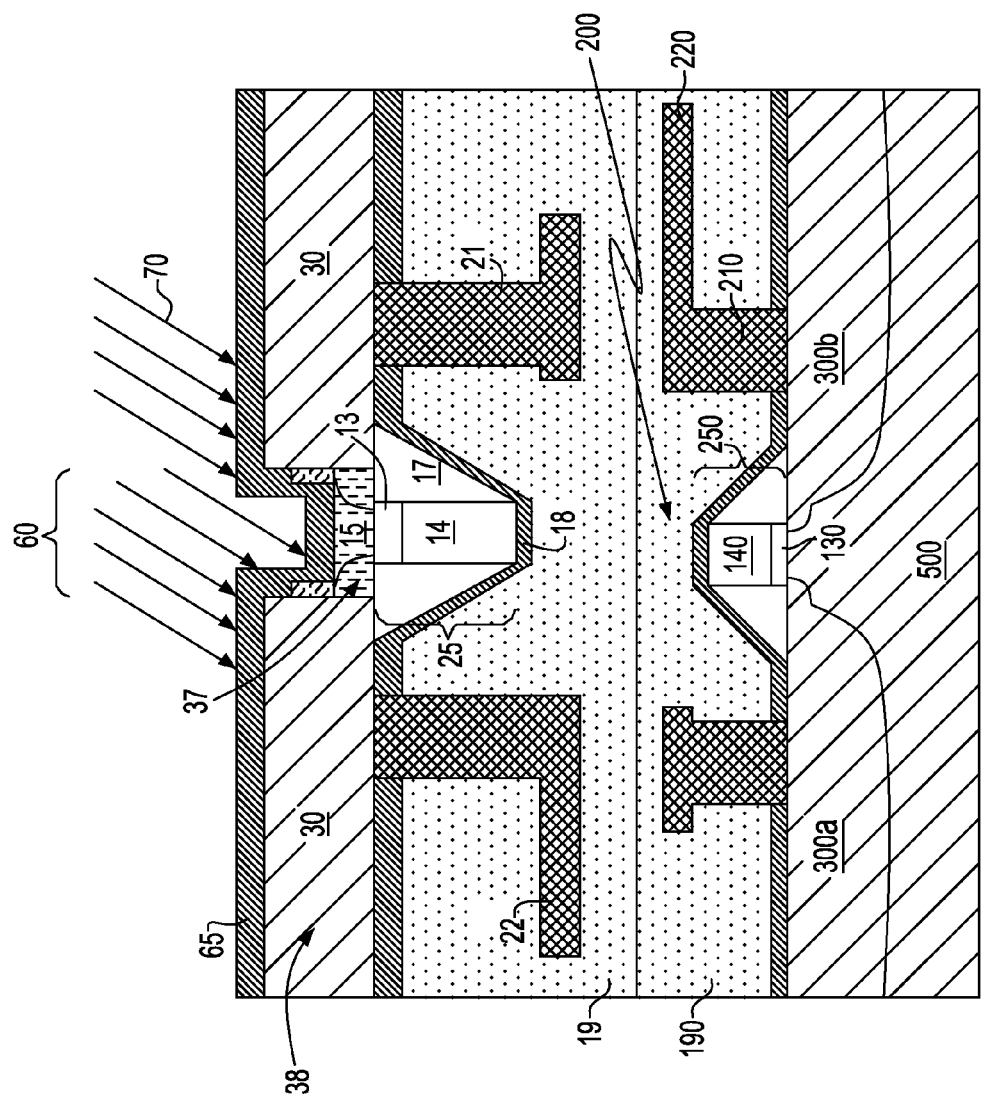
FIG. 9 is a side cross-sectional view depicting applying an angled ion implant to produce a damage portion of the conformal dielectric layer on only one side of the recess, in accordance with one embodiment of the invention.
Figure 10:
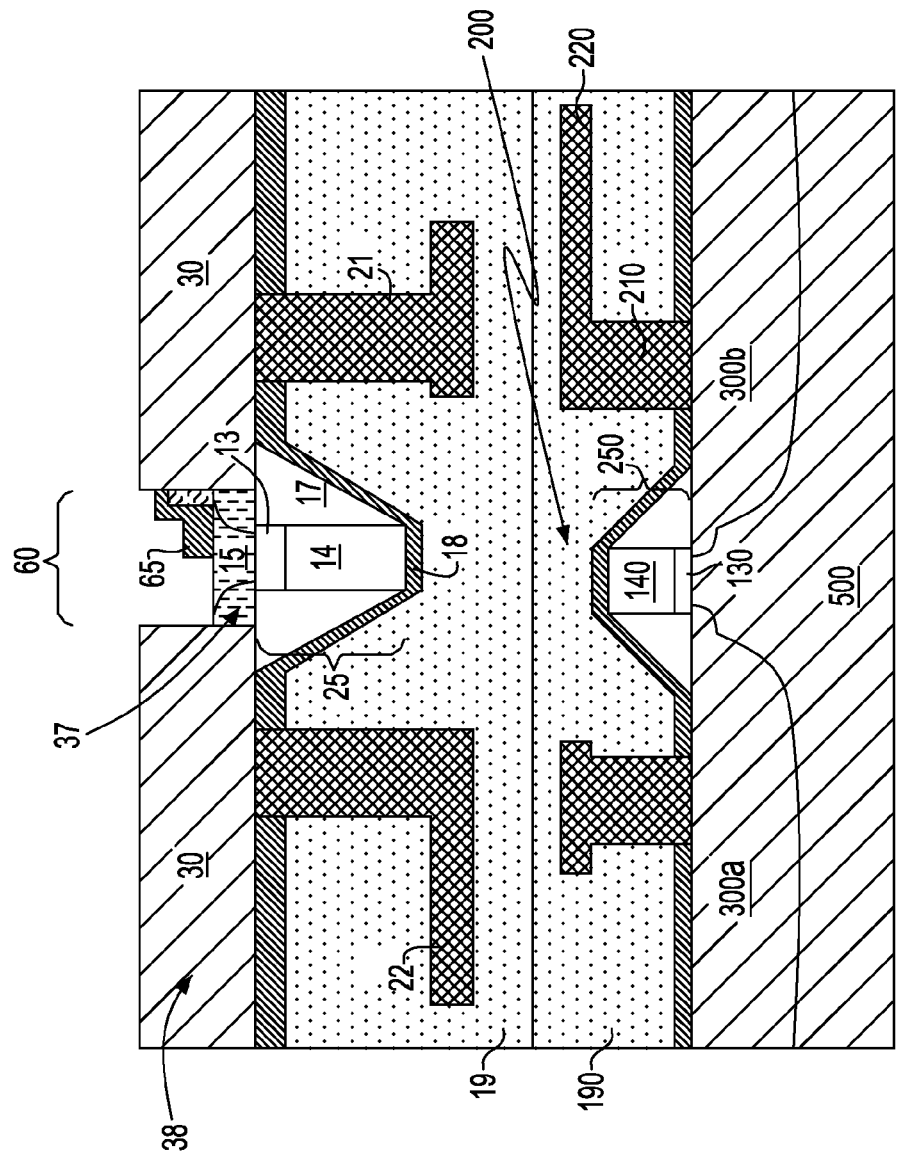
FIG. 10 is a side cross-sectional view depicting one embodiment of removing the damaged portion of the conformal dielectric layer to expose the remaining portion of the metal nitride layer that is on only the one side of the recess selective to a remaining portion the conformal dielectric layer that is not damaged, and removing the remaining portion of the metal nitride layer that has been exposed.

FIGS. 8-10 depict one embodiment of forming a metal nitride spacer 50 on one sidewall of the recess 60. Referring to FIG. 8, forming the metal nitride spacer 50 includes depositing a metal nitride layer 45 on a base and sidewalls of the recess 60, and etching the metal nitride layer 45, wherein a remaining portion of the metal nitride layer 45 is present on only the sidewalls of the recess 60. In one embodiment, the metal nitride layer 45 is composed of WN, WSiN, TiN, TiSiN, TaN, TaSiN, TiTaN, TaRuN or combinations thereof. In one embodiment, the metal nitride layer 45 is deposited using chemical vapor deposition (CVD), sputtering or plating. In one embodiment, the metal nitride layer 45 is composed of TiN and is deposited using sputtering. In one example, a metal nitride layer 45 composed of TiN is sputtered from a solid titanium target, in which the nitrogen content of the metal nitride layer 45 is introduced by a nitrogen gas. In another example, a metal nitride layer 45 composed of TiN is sputtered from a solid target comprised of titanium and nitrogen. In one example, the metal nitride layer 45 has a thickness ranging from 1 nm to 40 nm. In another example, the metal nitride layer 45 has a thickness ranging from 5 nm to 30 nm. In yet another example, the metal nitride layer 45 has a thickness ranging from 10 nm to 20 nm. In one embodiment, the metal nitride layer 45 is a conformal layer that is present on the sidewalls and the base of the recess 60.

An etch process may remove the metal nitride layer 45 from the base of the recess 60 so that a remaining portion of the metal nitride layer 45 is present only on the sidewalls of the recess 60. In one embodiment, the portion of the metal nitride layer 45 that is present on the base of the recess 60 is removed by an anisotropic etch process, such as reactive ion etch (RIE). In one embodiment, because the height of the metal nitride layer 45, as measured from the upper surface of the base of the recess 60, is greater for the metal nitride layer 45 that is present on the sidewalls of the recess 60 in comparison to the height of the metal nitride layer 45 that is present on the base of the recess 60, a portion of the metal nitride layer 45 may remain on the sidewalls of the recess 60 after the portion of the metal nitride layer 45 that is on the base of the recess 60 is removed by the anisotropic etch. In another embodiment, the metal nitride layer 45 that is present on the base of the recess 60 may be removed by an etch process, while the portion of the metal nitride layer 45 that is present on the sidewalls of the recess 60 is protected by an etch mask, such as a photoresist etch mask.

Still referring to FIG. 8, a conformal dielectric layer 65 may be deposited on the remaining portion of the metal nitride layer 45, and the conformal dielectric layer 65 may be deposited on the base of the recess 60. The conformal dielectric layer 65 may be composed of any dielectric material including, but not limited to an oxide, a nitride, and/or an oxynitride material. The conformal dielectric layer 65 may be formed by a deposition method, such as chemical vapor deposition (CVD). Variations of chemical vapor deposition (CVD) processes that are suitable for depositing the conformal dielectric layer include, but are not limited to: Atmospheric Pressure CVD (APCVD), Low Pressure CVD (LPCVD), Plasma Enhanced CVD (EPCVD), Metal-Organic CVD (MOCVD), and combinations thereof. Other examples for depositing a conformal dielectric layer 65 include atomic layer deposition (ALD), evaporation, reactive sputtering, chemical solution deposition and other like deposition processes. In one example, the conformal dielectric layer 65 has a thickness ranging from 1 nm to 40 nm. In another example, the conformal dielectric layer 65 has a thickness ranging from 5 nm to 30 nm. In yet another example, the conformal dielectric layer 65 has a thickness ranging from 10 nm to 20 nm. In one embodiment, the conformal dielectric layer 65 is a nitride, such as silicon nitride.

FIG. 9 depicts applying an angled ion implant 70 to produce a damage portion of the conformal dielectric layer 65 on only one side of the recess 60. In one embodiment, the term "damaged" means that the crystalline structure, such as the lattice structure, of the material being subject to implantation has been altered by the implanted species. In another example, the term "damaged" means that the porosity of the structure being subjected to implantation is increased by the implanted species. In one embodiment, the damaged portion of the conformal dielectric layer 65 is provided by ion implantation of at least one ion of H, He, Ne, C, O, F, B, P, Ar, or Si, including isotopes thereof. In one embodiment, the ions are implanted using an ion dosage from $1 \times 10^{14}$ atoms/$cm^2$ to $3 \times 10^{16}$ atoms/$cm^2$, with an ion dosage from $2 \times 10^{14}$ atoms/$cm^2$ to $2.8 \times 10^{16}$ atoms/$cm^2$ being more typical. The ion implantation is typically carried out in an ion implantation apparatus that operates at a beam current density from 0.05 milliamps $cm^{-2}$ to 50 milliamps $cm^{-2}$ and at an energy from 4 keV to 250 keV. In one embodiment, the implant is performed using an energy from 5 keV to 200 keV.

In one embodiment, the ion implantation apparatus is angled so that the vector by which the ions are traveling contacts the surface being implanted at an angle of less than 85°. In another embodiment, the angle at which the ions contact the implanted surface ranges from 15° to 75°. In yet another embodiment, the angle at which the ions contact the implanted surface ranges from 25° to 65°. It is noted that the above angles are provided for illustrative purposes only, and that other angles can be employed, and are within the scope of the present invention, so long as the angle selected introduces the implant dopant to the conformal dielectric layer 65 on only one side of the recess 60.

FIG. 10 depicts removing the damaged portion of the conformal dielectric layer 65 to expose the remaining portion of the metal nitride layer 45 that is on only the one side of the recess 60 selective to the portion the conformal dielectric layer 65 that is not damaged. In one example, the damaged portion of the conformal dielectric layer 65 may be removed by one or more etching steps. In one embodiment, the damaged portion of the conformal dielectric layer 65 is removed by a wet or dry etch process, which is selective to the non-damaged portion of the conformal dielectric layer 65. In one embodiment, in which the conformal dielectric layer 65 is composed of silicon nitride, and is damaged by ion implantation of Ar, the etch chemistry for removing the damaged portion of the conformal dielectric layer 65 selective to the non-damage portion of the conformal dielectric layer is composed of buffered HF (BHF)/dilute HF (DHF). Removing the damaged portion of the conformal dielectric layer 65 exposes the metal nitride layer 45 that is present on one side of the recess 60.

FIG. 10 further depicts removing the exposed portion of the metal nitride layer 45 that is on the sidewalls of the recess 60 from only the one side of the recess 60, wherein a remaining portion of the metal nitride layer 45 provides the metal nitride spacer 50. The metal nitride spacer 50 that is positioned in the portion of the channel region of the first semiconductor device 100 that is underlying the extension implant portion 37 of the source region, and is adjacent to the edge of the deep implant portion 38 of the source region. In one embodiment, the metal nitride spacer 50 shorts one side of the pn junction that is provided by the doping of the channel region and the source region. In one embodiment, the exposed portion of the metal nitride layer 45 is removed by a selective etch process, in which the etch chemistry removed the exposed portion of the metal nitride layer 45 selective to a remaining portion of the conformal dielectric layer 65. In one example, in which the conformal dielectric layer 65 is composed of silicon nitride and the metal nitride layer 45 is composed of TiN, the etch chemistry comprises plasma etch process like $CF_4$.

Figure 11:
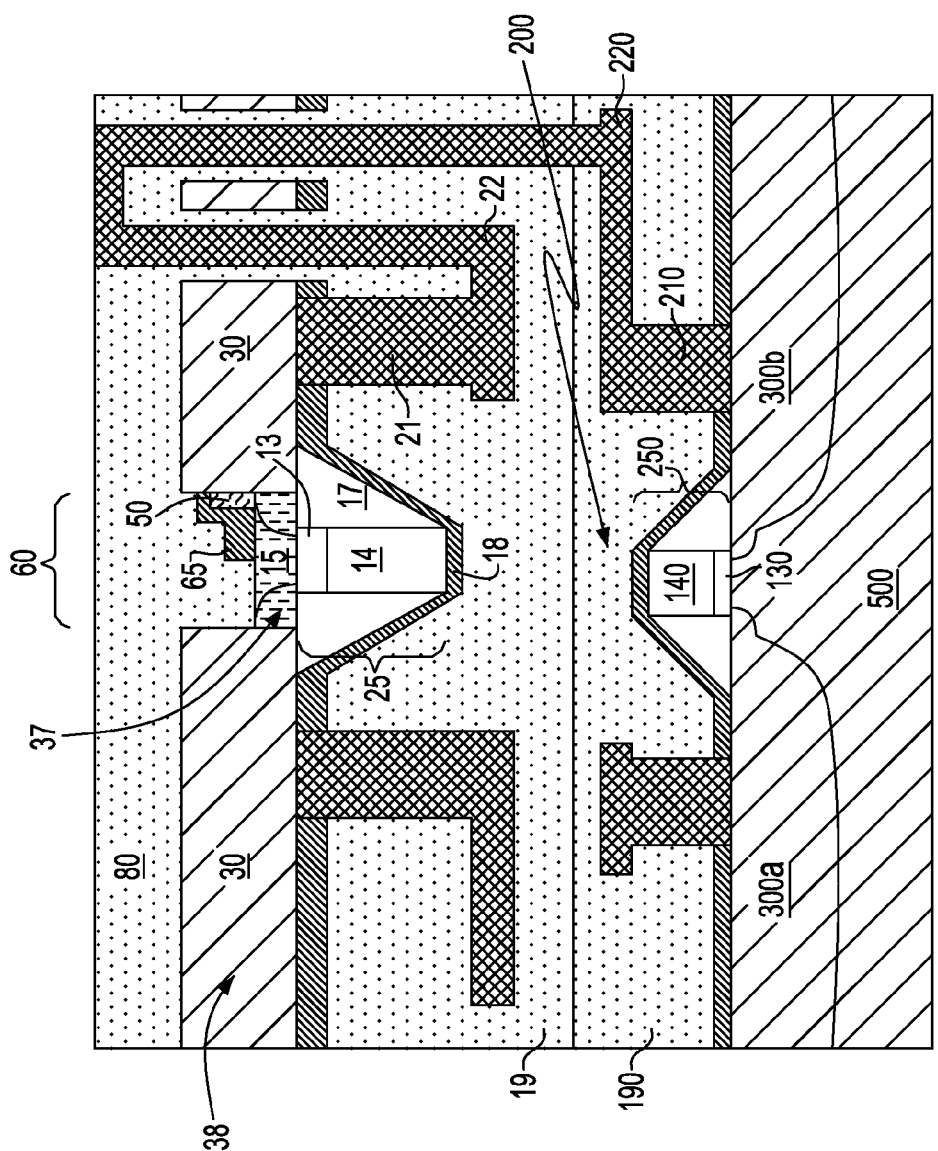
FIG. 11 is a side cross-sectional view depicting blanket depositing a dielectric material to fill the recess and forming electrical interconnects to provide electrical communication between the first semiconductor device and the second semiconductor device, in accordance with one embodiment of the present invention.

FIG. 11 depicts one embodiment of blanket depositing a dielectric material 80 to fill the recess 60 and forming electrical interconnects to provide electrical communication between the first semiconductor device 100 and the second semiconductor device 200. The dielectric material 80 may be blanket filling the recess and overlying third semiconductor layer 30. The dielectric material 80 may be selected from the group consisting of silicon-containing materials such as $SiO_2$, $Si_3N_4$, $SiO_xN_y$, SiC, SiCO, SiCOH, and SiCH compounds, carbon-doped oxides, inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). The blanket layer of the dielectric material 80 may be formed by various methods well known to those skilled in the art, including, but not limited to spinning from solution, spraying from solution, chemical vapor deposition (CVD), plasma enhanced CVD (PECVD), and evaporation.

The dielectric material 80, the first inter-level dielectric layer 19, and the second inter-level dielectric layer 190 may be patterned and etched to form via holes to the first interconnect line 22 of the first semiconductor device 100 and the second interconnect line 220 of the second semiconductor device 200. Third conductive studs 310 may be formed within the vias to provide electrical communication between the first semiconductor device 100 and the second semiconductor device.

FIG. 11 depicts one embodiment of a device having an asymmetrical junction. In one embodiment, the device comprises a first semiconductor device 100 including a first gate structure 25 on a first channel region of a first semiconductor substrate 5 and a first source region and a first drain region (indicated by extension implant portion 37 and deep implant portion 38) present within the first semiconductor substrate 5 on opposing sides of the first channel region, in which a metal nitride spacer 50 is present on only one side of the first channel region. The device further includes a second semiconductor device 200 including a second gate structure 250 on a second channel region of a second semiconductor substrate and a second source region 300a and a second drain region 300b present within the second semiconductor substrate 50 on opposing sides of the second channel region. At least one inter-level dielectric layer 19, 190 is present between the first semiconductor device 100 and the second semiconductor device 200, in which at least one of the first semiconductor device 100 and the second semiconductor device 200 is inverted. Interconnects 21, 22, 210, 220, 310 may be present providing electrical communication between the first semiconductor device 100 and the second semiconductor device 200, in which the interconnects 21, 22, 210, 220, 310 extend through the at least one inter-level dielectric layer 19, 190.

FIGS. 12-15 depict one embodiment of a method for a semiconductor device having a reverse halo dopant profile. Prior halo implants reduce short channel effects, but prior halo implant profiles reduce the mobility of the charge carriers of the semiconductor device by increasing the dopants that are present in the channel region of the device. In one embodiment of the present invention, a reverse halo dopant profile introduced through backside of the device, i.e., the backside of the second semiconductor layer 15 that contains the channel region, reduces the concentration of halo dopants in the inversion layer of the semiconductor device. In some embodiments, by reducing the concentration of the halo dopants in the inversion layer of the semiconductor device, the present invention by introducing the halo implants through the backside of the device substantially eliminates the degradation of the carrier mobility that typically results in prior methods that implant the halo dopants through the front side of the semiconductor device.

Figure 12:
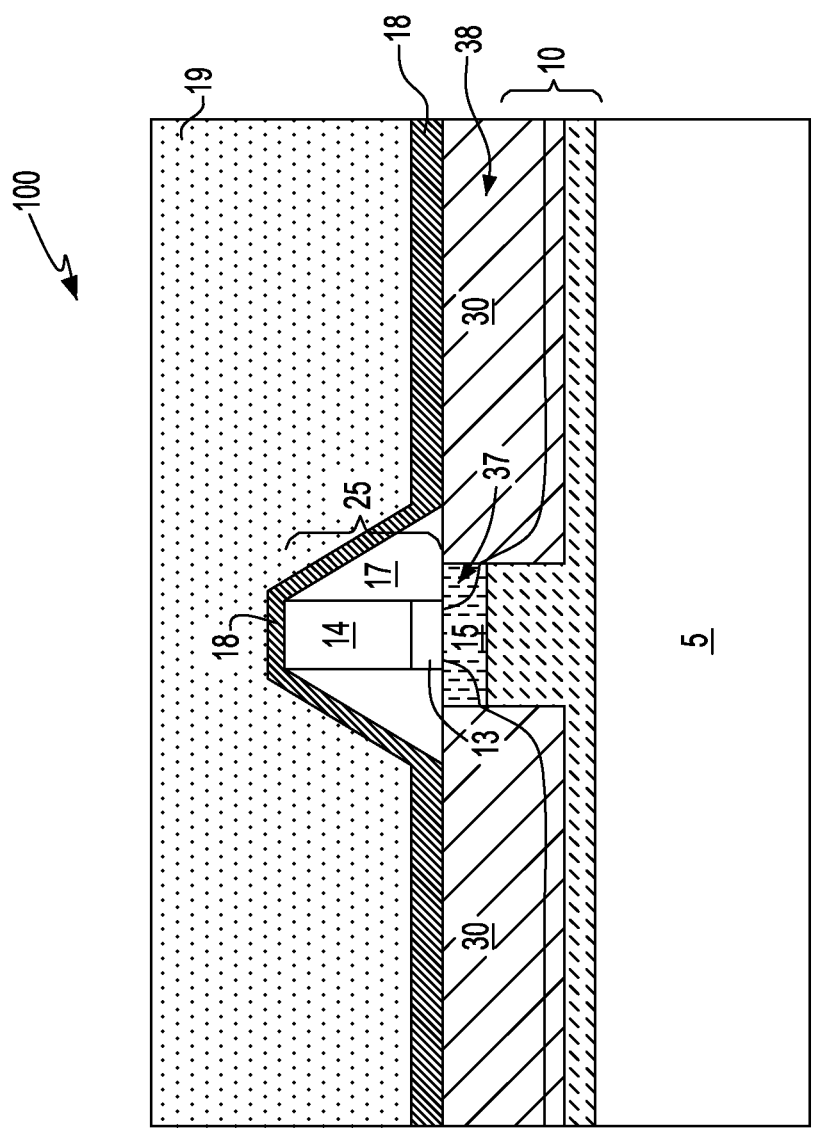
FIG. 12 is a side cross-sectional view depicting forming a conformal passivation layer and an inter-level dielectric layer over the structure depicted in FIG. 3, in a method for forming a semiconductor device having a reverse halo profile, in accordance with one embodiment of the present invention.

FIG. 12 depicts one embodiment of a first semiconductor device 100, as depicted in FIG. 3, having a passivation layer 18 and a first inter-level dielectric layer 19 being deposited overlying the first semiconductor device 100. It is noted that the structures included in FIG. 12, such as the first substrate 5, first semiconductor layer 10, second semiconductor layer 15, third semiconductor layer 30, first gate structure 25 and the source and drain regions, have been described in FIGS. 1-3. The passivation layer 18 and the first inter-level dielectric layer 19 depicted in FIG. 12 are similar to the passivation layer 10 and the first inter-level dielectric layer 19 that are described above with reference to FIG. 4.

Figure 13:
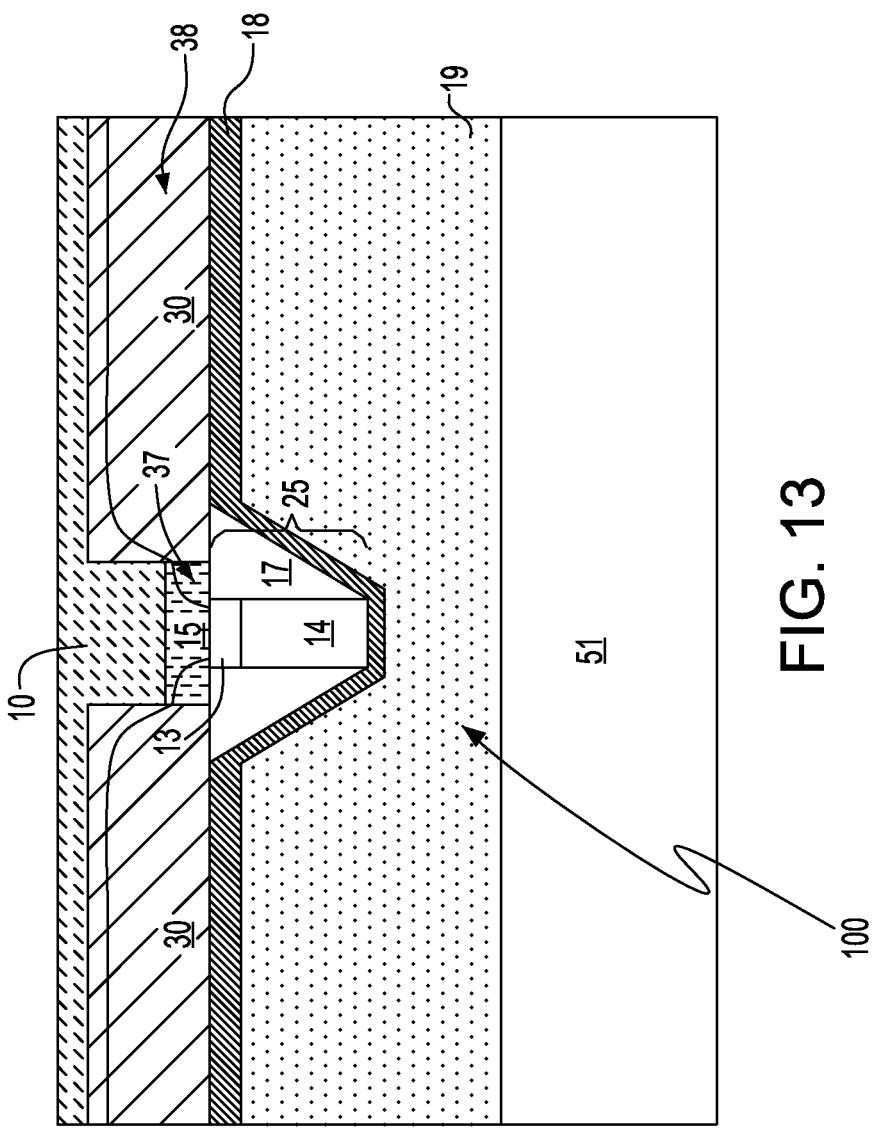
FIG. 13 is a side cross-sectional view depicting removing the first substrate from the structure depicted in FIG. 12 to expose a surface of the first semiconductor layer that is opposite the surface of the first semiconductor layer that is in contact with the second semiconductor layer, in accordance with one embodiment of the present invention.

Referring to FIG. 13, the structure depicted in FIG. 12 may be flipped and the first substrate 5 is removed to expose the first semiconductor layer 10. In one embodiment, the first substrate 5 may be removed by an etch process, such as a dry etch process, e.g., RIE, or a wet etch process. In another embodiment, the first substrate 5 may be removed using planarization, in which the planarization process stops when reaching the first semiconductor layer 10.

Figure 14:
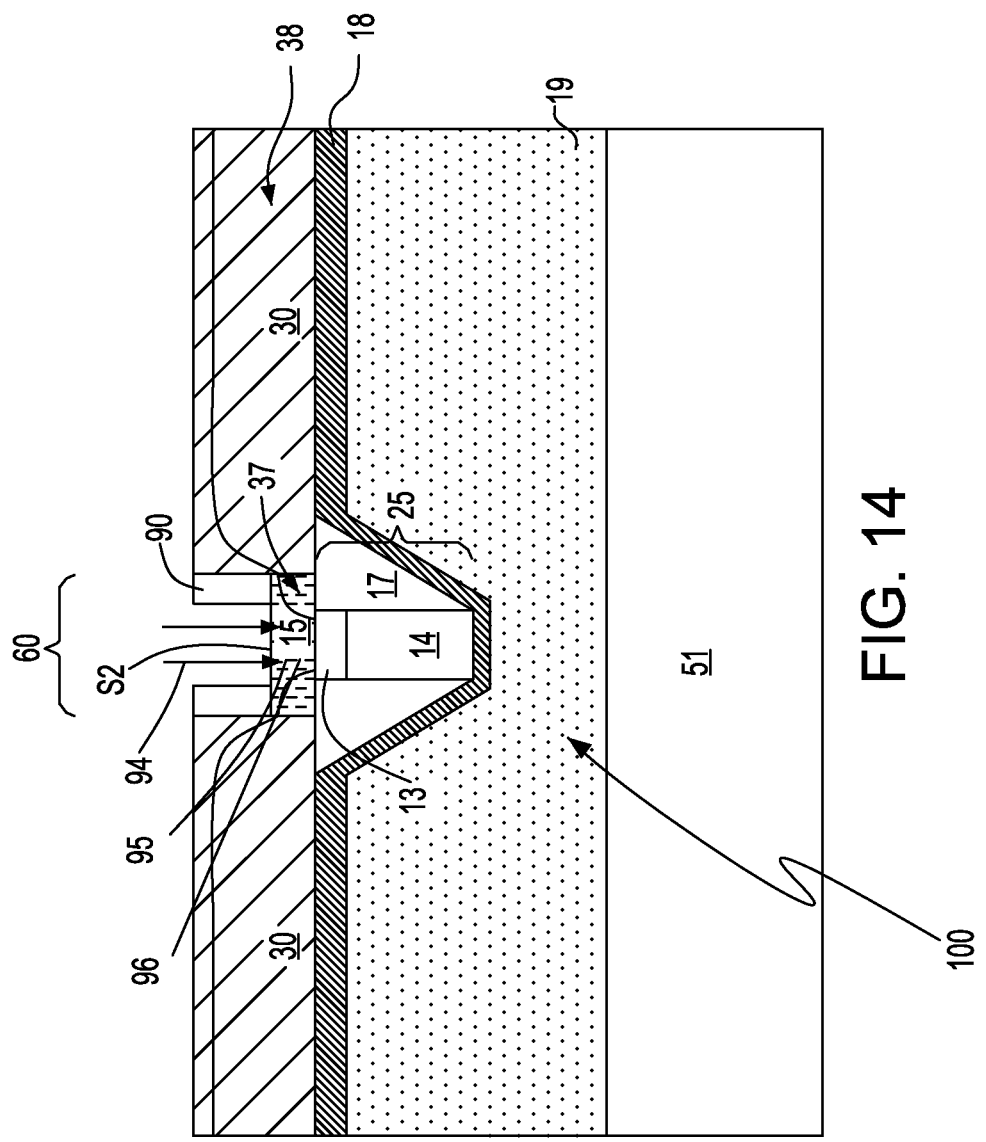
FIG. 14 is a side cross-sectional view depicting one embodiment of removing the first semiconductor layer selective to the at least the second semiconductor layer of the structure depicted in FIG. 13 to provide a recess aligned to the first gate structure, forming dielectric spacers on sidewalls of the recess, and implanting a halo region into the second semiconductor layer through the recess.

FIG. 14 depicts removing the first semiconductor layer 10 to expose the backside surface S2 of the remaining portion of the second semiconductor layer 15 that is underlying the first gate structure 25. FIG. 14 depicts removing the first semiconductor layer 10 that is present underlying the first gate structure 25 to provide a recess 60 aligned to the first gate structure 25. In one embodiment, the recess 60 is provided by removing the remaining portion of the first semiconductor layer 10 by an etch processes that is selective to the second semiconductor layer 15 and the third semiconductor layer 30. In one embodiment, the etch process for removing the first semiconductor layer 10 is a wet chemical etch. In another embodiment, the first semiconductor layer 10 is removed by an anisotropic etch, such as reactive ion etch (RIE). In some examples, prior to removing the first semiconductor layer 10, the first inter-level dielectric layer 19 is bonded to a handling wafer 51 to increase the structure's structural rigidity.

FIG. 14 further depicts forming a dielectric spacer 90 on the sidewalls of the recess 60. The dielectric spacer 90 may be composed of any dielectric material including, but not limited to oxides, nitrides, oxynitrides or combinations thereof. In some examples, the dielectric spacer 90 may be composed of silicon oxide, silicon nitride, or silicon oxynitirde. In one embodiment, the dielectric spacer 90 is formed by depositing a conformal dielectric layer on the sidewalls and base of the recess 60, and etching to remove the conformal dielectric layer from the base of the recess 60 providing an exposed backside surface S2 of the second semiconductor layer 15. In one embodiment, the conformal dielectric layer is deposited using chemical vapor deposition (CVD), such as plasma enhanced chemical vapor deposition (PECVD). In another example, the conformal dielectric layer is formed using a thermal growth process, such as thermal oxidation.

The conformal dielectric layer may be patterned and etched in which the remaining portion of the conformal dielectric layer is present on the sidewalls of the recess 60, and provide the dielectric spacer 90. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections of the conformal dielectric layer covered by the photoresist are protected, and provide the dielectric spacer 90, while the exposed regions are removed using a selective etching process that removes the unprotected regions. In one embodiment, the exposed portion of the conformal dielectric layer are removed by an anisotropic etch process, such as reactive ion etching. The width of each dielectric spacer 90 may range from 2 nm to 10 nm, and more typically ranging from 2 nm to 5 nm.

FIG. 14 also depicts ion implantation 94 of the portion of the second semiconductor layer 15 that is present between the dielectric spacers 90 through the backside surface S2 of the second semiconductor layer 15 to provide a halo implant region 95 having a reverse dopant profile. The term "reverse dopant profile" means that a greatest concentration of the halo dopant is present at the backside surface S2 of the second semiconductor layer 15, which is underlying the inversion portion 96 of the channel region. This is opposite a typical ion implantation processes of prior methods to provide halo regions that implant the halo dopant through the front surface of the device, and provide a greater concentration of halo dopant in the inversion portion 96 of the channel.

Halo regions typically have a conductivity that is opposite the conductivity of the source and drain regions. For example, when the source and drain regions are composed of a p-type dopant, the halo regions have an n-type conductivity, and vice versa. In one embodiment, the n-type dopant for the halo implant region 95 may be $BF_2$ implanted using an energy ranging from 20 keV to 40 keV with a dose ranging from $1 \times 10^{13}$ atoms/cm$^2$ to $1 \times 10^{14}$ atoms/cm$^2$. In another embodiment, the p-type dopant for the halo implant region 95 may As implanted using an energy ranging from 25 keV to 45 keV with a dose ranging from $1 \times 10^{13}$ atoms/cm$^2$ to $1 \times 10^{14}$ atoms/cm$^2$.

In one embodiment, the dopant concentration of the halo implant region 95 at the backside S2 of the second semiconductor layer 15 ranges from $1 \times 10^{17}$ atoms/cm$^3$ to $1 \times 10^{19}$ atoms/cm$^3$. In one embodiment, the concentration of the halo dopant that is present in the inversion portion 96 of the channel region that is closer to the front side surface of the second semiconductor layer 15 and the first gate structure 25 ranges from $1 \times 10^{18}$ atoms/cm$^3$ to $1 \times 10^{20}$ atoms/cm$^3$.

Figure 15:
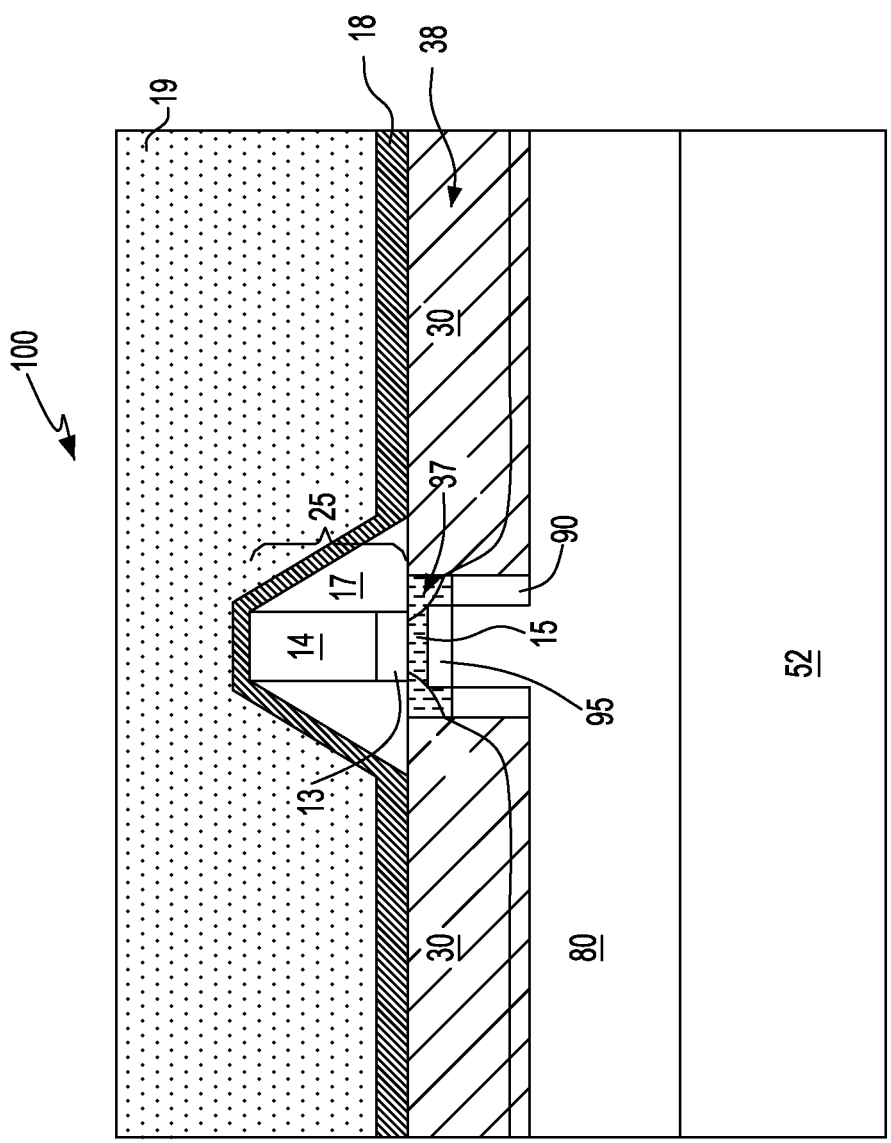
FIG. 15 is a side cross-sectional view depicting filling the recess depicted in FIG. 14 with a dielectric material and laser annealing the halo region to activate the dopant therein, in accordance with one embodiment of the present invention.

FIG. 15 depicts activating the halo dopant region 95, and filling the recess 60 with a dielectric material 80. In one embodiment, the halo dopant region 95 may be activated by laser annealing. In some examples, the temperature of the halo dopant region 95 during dopant activation ranges from 900° C. to 1100° C. In other examples, the temperature of the halo dopant region 95 during dopant activation ranges from 900° C. to 1100° C. The dielectric material 80 and its methods of deposition have been described above with reference to FIG. 11. A third semiconductor wafer 52 is depicted bonded to the dielectric material 80.

FIG. 15 depicts one embodiment of a semiconductor device 100 including a first gate structure 25 on a channel region of a semiconductor substrate 5. A source region and a drain region are present on opposing sides of the channel region, wherein the source region comprises an extension implant portion 37 and a deep implant portion 38 and the drain region comprises an extension implant portion 37 and a deep implant portion 38. In one embodiment, dielectric spacers 90 are present on each side of the channel region. The dielectric spacers 90 are underlying each of the extension implant regions 37 and adjacent to each of the deep implant regions. In one embodiment, the halo region 95 that is present in the channel region of the first semiconductor is aligned to the dielectric spacers 90, in which ends of the halo region 95 are aligned to interior sidewalls of the dielectric spacers 90.

While the invention has been particularly shown and described with respect to preferred embodiments thereof, it will be understood by those skilled in the art that the foregoing and other changes in form and details may be made therein without departing from the spirit and scope of the present invention.

What is claimed is:

1. An electrical device comprising:
a first semiconductor device comprising a first gate structure on a first channel region of a first semiconductor substrate and a first source region and a first drain region present within the first semiconductor substrate on opposing sides of the first channel region, wherein a metal nitride spacer is present on only one side of the first channel region;
a second semiconductor device comprising a second gate structure on a second channel region of a second semiconductor substrate and a second source region and a second drain region present within the second semiconductor substrate on opposing sides of the second channel region;
at least one interlevel dielectric layer present between the first semiconductor device and the second semiconductor device, in which at least one of the first semiconductor device and the second semiconductor device is inverted; and
interconnects providing electrical communication between the first semiconductor device and the second semiconductor device and extending through the at least one interlevel dielectric layer.

2. The electrical device of claim 1, wherein the metal nitride spacer provides an asymmetrical junction, wherein the metal nitride spacer is positioned in the portion of the first channel region that is underlying a first extension implant portion of one of the first source region or the first drain region.

3. The electrical device of claim 2, wherein the metal nitride spacer is adjacent to an edge of a deep implant portion of one of the first source region or the first drain region.

4. The electrical device of claim 1, wherein the metal nitride spacer is present underlying a first extension implant portion of the first source region.

5. The electrical device of claim 1, wherein the metal nitride spacer is present underlying a first extension implant portion of the first drain region.

6. The electrical device of claim 1, wherein the metal nitride spacer reduces a ratio of reverse bias current and forward bias current in comparison to a similarly structured semiconductor device that does not include the metal nitride spacer.

7. The electrical device of claim 1, wherein the first gate structure comprises at least one first gate dielectric and at least one first gate conductor.

8. The electrical device of claim 1, wherein the first gate structure is present on an island of semiconductor material.

9. The electrical device of claim 8, wherein the first source region and the first drain region are present in a second composition of a semiconductor material that is present adjacent to the island of the semiconductor material of the first composition.

10. The electrical device of claim 1, wherein a metal nitride of the metal nitride spacer is selected from the group consisting of WN, WSiN, TiN, TiSiN, TaN, TaSiN, TiTaN, TaRuN and combinations thereof.

11. The electrical device of claim 9 further comprising a dielectric spacer encapsulating the metal nitride spacer between the island of the semiconductor material and the second composition of the semiconductor material that provides one of the source region and the drain region.

12. The electrical device of claim 1, wherein the second semiconductor device does not include a metal nitride spacer that is present on only one side of the second channel region.

13. A semiconductor device comprising:
a first gate structure on a channel region of a semiconductor substrate;
a source region and a drain region present within the semiconductor substrate on opposing sides of the channel region, wherein the source region comprises an extension implant portion and a deep implant portion and the drain region comprises an extension implant portion and a deep implant portion;
a dielectric spacers present on each side of the channel region, the dielectric spacers underlying each of the extension implant portion, and adjacent to each of the deep implant portion; and
a halo region in the channel region, in which ends of the halo region are aligned to interior sidewalls of the dielectric spacers.

14. The semiconductor device of claim 13, wherein the halo region have a reverse halo dopant profile.

15. The semiconductor device of claim 13, wherein the halo region have a conductivity that is opposite the conductivity of the source region and the drain region.

16. The semiconductor device of claim 13, wherein the first gate structure comprises at least one gate dielectric and at least one gate conductor.

17. The semiconductor device of claim 16, wherein the first gate structure is present on an island of semiconductor material.

18. The semiconductor device of claim 17, wherein the source region and first drain region are present in a second composition of a semiconductor material that is present adjacent to the island of the semiconductor material of the first composition.

19. The electrical device of claim 13, wherein the dielectric spacers comprise silicon oxide, silicon nitride, silicon oxynitride or a combination thereof.

* * * * *